United States Patent
Lee et al.

(10) Patent No.: US 9,472,245 B2
(45) Date of Patent: Oct. 18, 2016

(54) SENSE AMPLIFIER AND RELATED METHOD

(71) Applicant: Taiwan Semiconductor Manufacturing Company, Ltd., Hsin-Chu (TW)

(72) Inventors: Po-Hao Lee, Hsin-Chu (TW); Chung-Cheng Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 14/145,700

(22) Filed: Dec. 31, 2013

(65) Prior Publication Data

US 2015/0187394 A1    Jul. 2, 2015

(51) Int. Cl.
  *G11C 7/06*    (2006.01)
  *G11C 13/00*   (2006.01)
  *G11C 11/16*   (2006.01)

(52) U.S. Cl.
  CPC .............. *G11C 7/06* (2013.01); *G11C 7/065* (2013.01); *G11C 11/1673* (2013.01); *G11C 13/004* (2013.01); *G11C 2013/0054* (2013.01)

(58) Field of Classification Search
  None
  See application file for complete search history.

(56) References Cited

U.S. PATENT DOCUMENTS

| | | | | |
|---|---|---|---|---|
| 5,657,275 A | * | 8/1997 | Yoshida | G11C 7/1078 365/189.05 |
| 2002/0093032 A1 | * | 7/2002 | Hanzawa | G11C 7/14 257/200 |
| 2004/0120200 A1 | * | 6/2004 | Gogl | G11C 7/067 365/210.1 |
| 2014/0050010 A1 | * | 2/2014 | Toda | G11C 13/004 365/148 |

* cited by examiner

*Primary Examiner* — James G Norman
(74) *Attorney, Agent, or Firm* — Slater Matsil, LLP

(57) ABSTRACT

A device includes first and second current mirrors electrically connected to reference and cell current sources of a memory array. A first inverter is electrically connected to the first current mirror, and a second inverter is electrically connected to the second current mirror. The first and second inverters are cross-coupled.

20 Claims, 4 Drawing Sheets

SENSE AMPLIFIER AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

Shrinking the semiconductor process node entails reductions in operating voltage and current consumption of electronic circuits developed in the semiconductor process node. For example, operating voltages have dropped from 5V to 3.3V, 2.5V, 1.8V, and even 0.9V. A wave of mobile device popularity has increased pressure in the industry to develop low power circuits that only drain minimal operating current from batteries that power the mobile devices. Lower operating current extends battery life of battery-operated mobile devices, such as smartphones, tablet computers, ultrabooks, and the like.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely sense amplifier circuits and related methods. Other embodiments may also be applied, however, to other types of sensing or amplifying circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel sense amplifier circuit and method are introduced. The sense amplifier circuit uses current mirror to prevent read disturb in a memory cell array connected to the sense amplifier.

Figure 1:
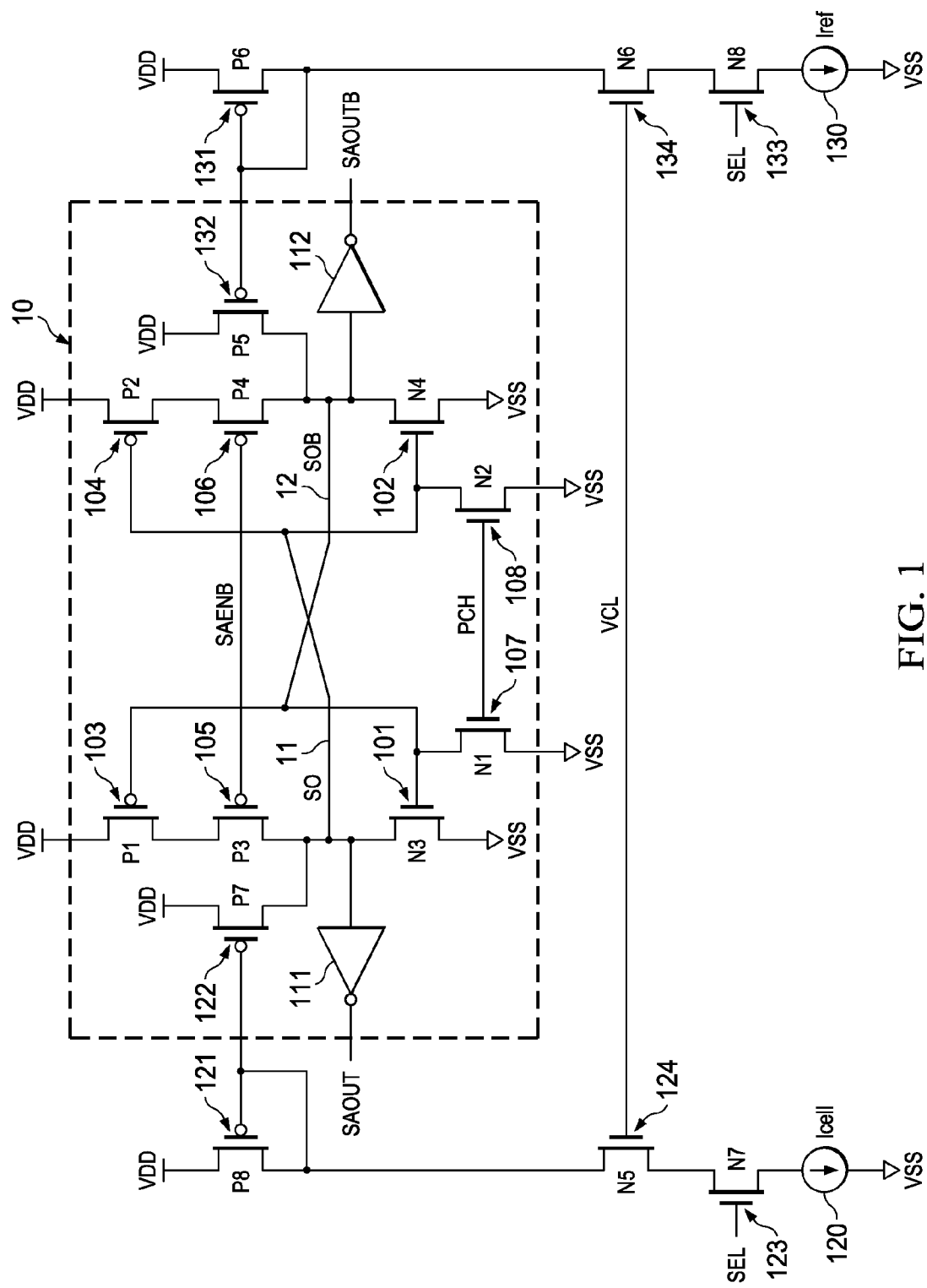
FIG. 1 is a diagram showing a differential current sense amplifier circuit in accordance with various embodiments of the present disclosure.

FIG. 1 is a diagram showing a differential current sense amplifier circuit 10 (or "sense amplifier 10") in accordance with various embodiments of the present disclosure. In some embodiments, the sense amplifier 10 reads data stored on at least one memory cell. In some embodiments, the at least one memory cell is a resistive random access memory (RRAM) cell, a magnetoresistive random access memory (MRAM) cell, a flash random access memory (RAM) cell, or the like. During a read operation, a memory cell can be considered a current source 120 (or "cell current source 120") that generates a cell current Icell that has amplitude corresponding to a programmed state of the memory cell. For example, if the data stored on the memory cell is binary "1," the cell current Icell may be a relatively high current. If the data stored on the memory cell is binary "0," the cell current Icell may be a relatively low current. To read the data on the memory cell, the cell current Icell may be compared with a reference current Iref generated by a reference current source 130. The sense amplifier 10 compares the cell current Icell with the reference current Iref, and outputs a differential signal SAOUT/SAOUTB that indicates whether the data on the memory cell is binary "1" or "0." In some embodiments, the reference current source 130 is another memory cell of a memory array including the memory cell that acts as the cell current source 120. In some embodiments, the memory cell that acts as the reference current source 130 is not used in the memory array to store data (e.g., a dummy memory cell).

In some embodiments, the cell current Icell and the reference current Iref are mirrored to the sense amplifier 10. Transistors 121-124 form a cell-side mirror circuit for mirroring the cell current Icell to the sense amplifier 10. Transistors 131-134 form a reference-side mirror circuit for mirroring the reference current Iref to the sense amplifier 10. Mirroring the cell and reference currents Icell, Iref to the sense amplifier 10 provides isolation that is beneficial to preventing read disturb, and also allows the reference current source 130 to be shared by at least two sense amplifiers of the memory array including the memory cell.

The transistor 121 has a source electrode that is electrically connected to a first voltage supply node. In some embodiments, the first voltage supply node supplies a first voltage VDD (e.g., 5 Volts, 3.3 Volts, 2.5 Volts, 1.8 Volts, 0.9 Volts, or the like). A drain electrode of the transistor 121 is electrically connected to a gate electrode of the transistor 121.

The transistor 122 has a source electrode that is electrically connected to the first voltage supply node. A gate electrode of the transistor 122 is electrically connected to the gate electrode of the transistor 121. A drain electrode of the transistor 122 is electrically connected to a node 11 of the sense amplifier 10. In some embodiments, the transistors 121, 122 are P-type metal-oxide-semiconductor (PMOS) transistors.

The transistor 131 has a source electrode that is electrically connected to a first voltage supply node. In some embodiments, the first voltage supply node supplies a first voltage VDD (e.g., 5 Volts, 3.3 Volts, 2.5 Volts, 1.8 Volts, 0.9

Volts, or the like). A drain electrode of the transistor 131 is electrically connected to a gate electrode of the transistor 131.

The transistor 132 has a source electrode that is electrically connected to the first voltage supply node. A gate electrode of the transistor 132 is electrically connected to the gate electrode of the transistor 131. A drain electrode of the transistor 132 is electrically connected to a node 12 of the sense amplifier 10. In some embodiments, the transistors 131, 132 are PMOS transistors.

The transistors 123, 133 are select transistors. A gate electrode of the transistor 123 is configured to receive a select signal SEL from a controller (e.g., an address decoder, or the like). A source electrode of the transistor 123 is electrically connected to the cell current source 120 (e.g., the memory cell). A drain electrode of the transistor 123 is electrically connected to a source electrode of the transistor 124.

A gate electrode of the transistor 133 is configured to receive the select signal SEL. A source electrode of the transistor 133 is electrically connected to the reference current source 130. A drain electrode of the transistor 133 is electrically connected to a source electrode of the transistor 134.

The transistors 124, 134 are clamp transistors that prevent high voltages from damaging the cell current source 120 and the reference current source 130. A gate electrode of the transistor 124 is electrically connected to a gate electrode of the transistor 134. A drain electrode of the transistor 124 is electrically connected to the drain electrode of the transistor 121. The source electrode of the transistor 124 is electrically connected to the drain electrode of the transistor 123.

The gate electrode of the transistor 134 is electrically connected to the gate electrode of the transistor 124. The gate electrodes of the transistors 124, 134 are configured to receive a clamp voltage VCL from a controller. A drain electrode of the transistor 134 is electrically connected to the drain electrode of the transistor 131. The source electrode of the transistor 134 is electrically connected to the drain electrode of the transistor 133. In some embodiments, the transistors 123, 124, 133, 134 are N-type metal-oxide-semiconductor (NMOS) transistors.

When the transistors 123, 124, 133, 134 are turned on, the cell current Icell is mirrored to the transistor 122, and the reference current Iref is mirrored to the transistor 132.

In the sense amplifier 10, the transistors 101, 103, 105 form a first inverter, and the transistors 102, 104, 106 form a second inverter. The first inverter is configured to be enabled or disabled by the transistor 105. The second inverter is configured to be enabled or disabled by the transistor 106. In some embodiments, the transistors 101, 102 are NMOS transistors, and the transistors 103-106 are PMOS transistors.

A gate electrode of the transistor 101 is electrically connected to the node 12. The node 12 corresponds to at least one of the drain electrode of the transistor 132, a drain electrode of the transistor 102 or a drain electrode of the transistor 106. A drain electrode of the transistor 101 is electrically connected to the node 11. The node 11 corresponds to at least one of the drain electrode of the transistor 122, a gate electrode of the transistor 102 or a drain electrode of the transistor 105. A source electrode of the transistor 101 is electrically connected to the second voltage supply node.

A gate electrode of the transistor 103 is electrically connected to the gate electrode of the transistor 101. A source electrode of the transistor 103 is electrically connected to the first voltage supply node. A drain electrode of the transistor 103 is electrically connected to a source electrode of the transistor 105.

A gate electrode of the transistor 102 is electrically connected to the node 11. A drain electrode of the transistor 102 is electrically connected to a node 12. A source electrode of the transistor 102 is electrically connected to the second voltage supply node.

A gate electrode of the transistor 104 is electrically connected to the gate electrode of the transistor 102. A source electrode of the transistor 104 is electrically connected to the first voltage supply node. A drain electrode of the transistor 104 is electrically connected to a source electrode of the transistor 106.

The transistors 105, 106 act as enable circuits of the first inverter and the second inverter, and are configured to receive a sense amplifier enable bar signal SAENB from a controller. In some embodiments, the transistors 105, 106 are PMOS transistors. A gate electrode of the transistor 105 is electrically connected to a gate electrode of the transistor 106. A source electrode of the transistor 105 is electrically connected to the drain electrode of the transistor 103. A source electrode of the transistor 106 is electrically connected to the drain electrode of the transistor 104. A drain electrode of the transistor 105 is electrically connected to the drain electrode of the transistor 101. A drain electrode of the transistor 106 is electrically connected to the drain electrode of the transistor 102.

In some embodiments, the sense amplifier 10 includes transistors 107, 108. The transistors 107, 108 are pre-charge transistors. In some embodiments, the transistors 107, 108 are NMOS transistors. A gate electrode of the transistor 107 is electrically connected to a gate electrode of the transistor 108. A pre-charge signal PCH is applied to the gate electrodes of the transistors 107, 108 by a controller. Source electrodes of the transistors 107, 108 are electrically connected to the second voltage supply node. A drain electrode of the transistor 107 is electrically connected to the gate electrode of the transistor 101 (the node 12). A drain electrode of the transistor 108 is electrically connected to the gate electrode of the transistor 102 (the node 11).

Comparators 111, 112 generate the sense amplifier out signal SAOUT and the sense amplifier out bar signal SAOUTB. In some embodiments, the comparators 111, 112 are inverters. An input terminal of the comparator 111 is electrically connected to the node 11, and is configured to receive a sense out signal SO. In some embodiments, the sense out signal SO is a voltage. An input terminal of the comparator 112 is electrically connected to the node 12, and is configured to receive a sense out bar signal SOB. In some embodiments, the sense out bar signal SOB is a voltage.

The sense amplifier 10 performs a read operation through at least three phases: a pre-charging phase, a charging phase, and a latching phase. In the pre-charging phase, the pre-charge signal PCH is asserted (e.g., logic high, a high voltage, VDD) to turn on the transistors 107, 108. The transistors 107, 108 conduct current to pull down voltage at the nodes 11, 12 to the second voltage VSS (e.g., ground, −VDD, or the like). With voltage at the nodes 11, 12 low, the transistors 101, 102 are turned off. The sense amp enable bar signal SAENB is a high voltage (e.g., sufficiently high to turn off the transistors 105, 106) during the pre-charging and charging phases.

Figure 2:
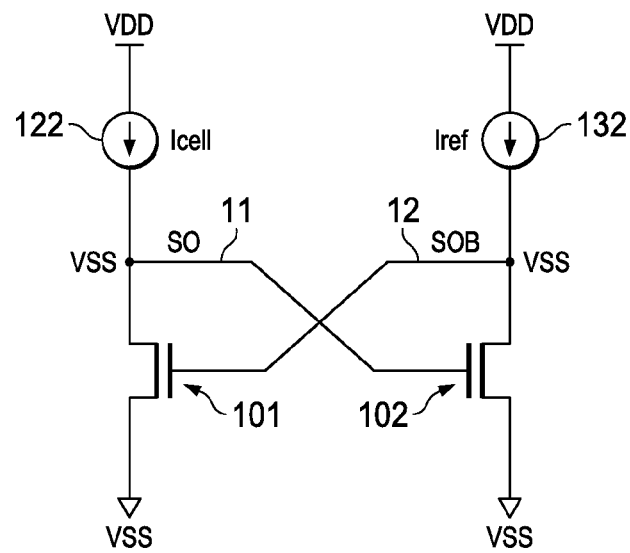
FIG. 2 is a diagram showing operation of the sense amplifier in a charging phase in accordance with various embodiments of the present disclosure.

FIG. 2 is a diagram showing operation of the sense amplifier 10 in the charging phase in accordance with various embodiments of the present disclosure. Depiction of the sense amplifier 10 is simplified in FIG. 2 for clarity of discussion. In the charging phase, the pre-charge signal PCH is disasserted, so that the transistors 107, 108 can be considered substantially open circuits. The sense amplifier enable bar signal SAENB is at a voltage high enough to turn off the transistors 105, 106, so that the transistors 105, 106 can be considered substantially open circuits.

In the charging phase, the nodes 11, 12 are initially at the second voltage VSS following the pre-charging phase. Depending on relative strength of the cell current Icell versus the reference current Iref, one or the other of the nodes 11, 12 is charged more rapidly than the other node. For example, if the cell current Icell is much stronger than the reference current Iref, the first current (substantially the cell current Icell) mirrored through the transistor 122 charges the node 11 more quickly than the second current (substantially the reference current Iref) mirrored through the transistor 132 charges the node 12. In this case, voltage at the node 11 (SO) is pulled up toward the first voltage VDD much more quickly than voltage at the node 12 (SOB). As a result, the transistor 102 turns on before the transistor 101 turns on (if at all). The transistor 102 pulls down the voltage at the node 12 (SOB) toward the second voltage VSS. The node 11 reaches a steady-state voltage of about the first voltage VDD (e.g., binary "1"), and the node 12 reaches a steady-state voltage of about the second voltage VSS (e.g., binary "0").

If the cell current Icell is weaker than the reference current Iref, the first current (substantially the cell current Icell) mirrored through the transistor 122 charges the node 11 less quickly than the second current (substantially the reference current Iref) mirrored through the transistor 132 charges the node 12. In this case, voltage at the node 11 (SO) is pulled up toward the first voltage VDD slower than voltage at the node 12 (SOB). As a result, the transistor 101 turns on before the transistor 102 turns on (if at all). The transistor 101 pulls down the voltage at the node 11 (SO) toward the second voltage VSS. The node 12 reaches a steady-state voltage of about the first voltage VDD (e.g., binary "1"), and the node 11 reaches a steady-state voltage of about the second voltage VSS (e.g., binary "0").

Figure 3:
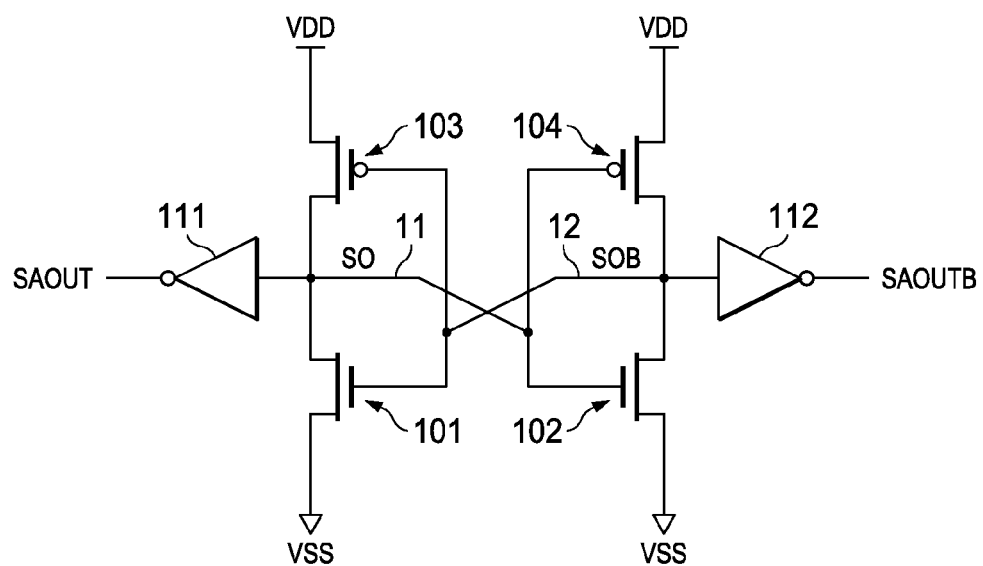
FIG. 3 is a diagram showing operation of the sense amplifier in a latching phase in accordance with various embodiments of the present disclosure.

FIG. 3 is a diagram showing operation of the sense amplifier 10 in the latching phase in accordance with various embodiments of the present disclosure. In the latching phase, the sense amplifier enable bar signal SAENB is at a voltage low enough to turn on the transistors 105, 106. Biased by the low voltage, the transistors 105, 106 are on, and are thus represented as short circuits in the circuit diagram of FIG. 3 for ease of illustration. With the transistors 105, 106 turned on by the sense amplifier enable bar signal SAENB, the transistors 103, 104 and the transistors 101, 102 form two cross-coupled inverters. The transistor 101 and the transistor 103 form a first inverter, and the transistors 102, 104 form a second inverter. Output of the first inverter is at the node 11 (SO). A first-side amplifier 111 has an input terminal electrically connected to the output of the first inverter. In some embodiments, the first-side amplifier 111 is an inverter having circuit structure similar to the first inverter. In some embodiments, the first-side amplifier 111 acts as a buffer. Input of the first inverter is electrically connected to the node 12.

Output of the second inverter is at the node 12 (SO). A second-side amplifier 112 has an input terminal electrically connected to the output of the second inverter. In some embodiments, the second-side amplifier 112 is an inverter having circuit structure similar to the second inverter. In some embodiments, the second-side amplifier 112 acts as a buffer. Input of the second inverter is electrically connected to the node 11.

Prior to the latching phase, when the cell current Icell is larger than the reference current Iref, the node 11 is charged to about the first voltage VDD, and the node 12 is charged to about the second voltage VSS. Under these conditions, the relatively high voltage (e.g., about VDD) at the node 11 turns on the transistor 102, and turns off the transistor 104, so that the voltage at the node 12 (SOB) is held at a relatively low voltage (e.g., about VSS). The relatively low voltage at the node 12 turns on the transistor 103, and turns off the transistor 101, so that the voltage at the node 11 (SOB) is held at the relatively high voltage (e.g., about VDD). The relatively high voltage at the node 11 is inverted by the first-side amplifier 111 to output the sense amplifier output signal SAOUT as about the second voltage VSS for the cell current Icell that is larger than the reference current Iref. The relatively low voltage at the node 12 is inverted by the second-side amplifier 112 to output the sense amplifier output bar signal SAOUTB as about the first voltage VDD.

Prior to the latching phase, when the cell current Icell is smaller than the reference current Iref, the node 12 is charged to about the first voltage VDD, and the node 11 is charged to about the second voltage VSS. Under these conditions, the relatively high voltage (e.g., about VDD) at the node 12 turns on the transistor 101, and turns off the transistor 103, so that the voltage at the node 11 (SO) is held at a relatively low voltage (e.g., about VSS). The relatively low voltage at the node 11 turns on the transistor 104, and turns off the transistor 102, so that the voltage at the node 12 (SO) is held at the relatively high voltage (e.g., about VDD). The relatively high voltage at the node 12 is inverted by the second-side amplifier 112 to output the sense amplifier output bar signal SAOUTB as about the second voltage VSS for the cell current Icell that is smaller than the reference current Tref. The relatively low voltage at the node 11 is inverted by the first-side amplifier 111 to output the sense amplifier output signal SAOUT as about the first voltage VDD.

Figure 4:
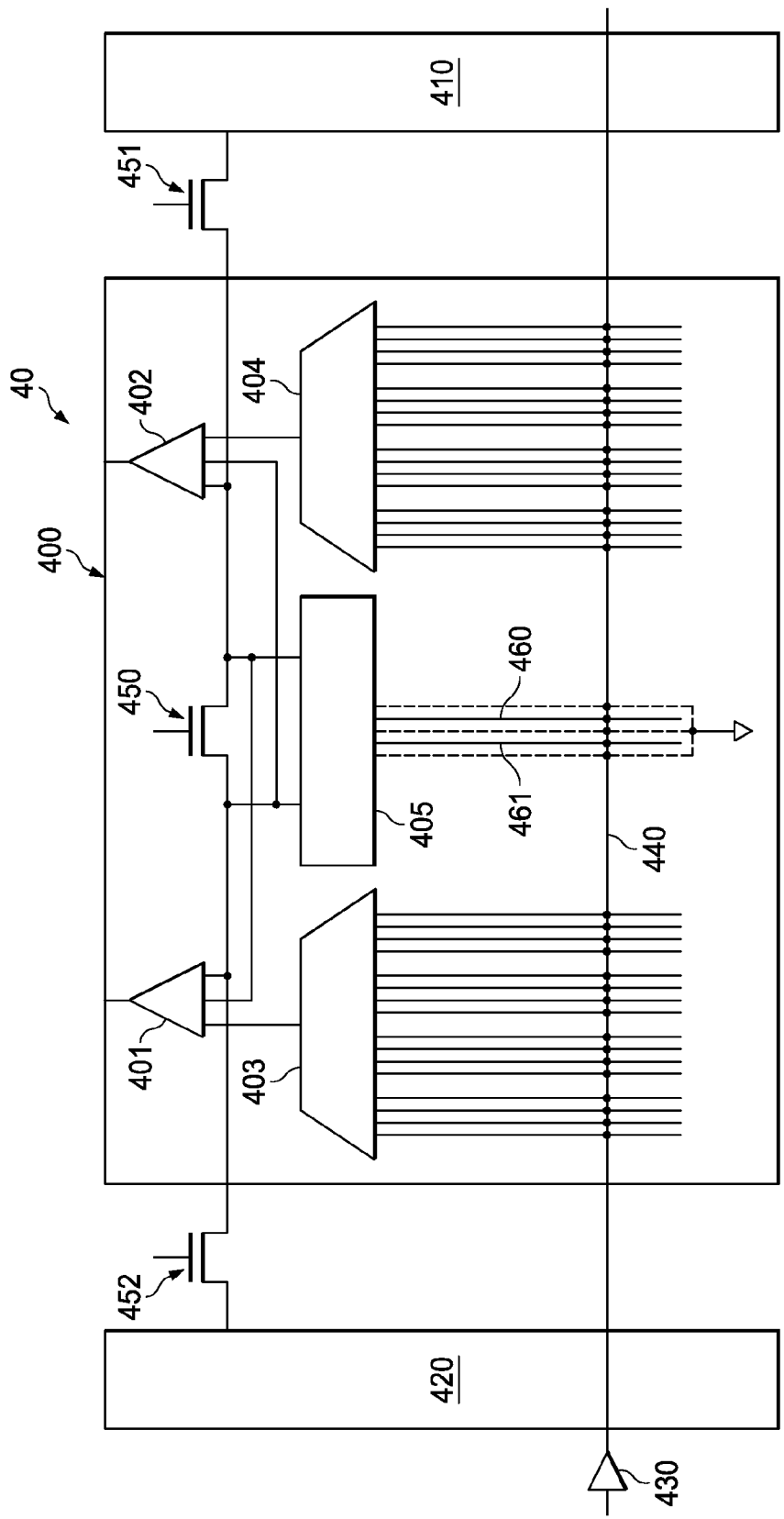
FIG. 4 is a diagram showing a readout circuit in accordance with various embodiments of the present disclosure.

FIG. 4 is a diagram showing a readout circuit 40 in accordance with various embodiments of the present disclosure. In some embodiments, a sense amplifier 401 is configured to read one of at least two memory cells. For example, in the configuration shown in FIG. 4, the sense amplifier 401 corresponds to 16 column lines, each column line corresponding to a single memory cell (e.g., an RRAM cell). In some embodiments, a sense amplifier 402 is configured to read a further group of memory cells (e.g., 16 memory cells). A multiplexer 403 selects one of the memory cells to be read by the sense amplifier 401 at a time. Input terminals of the multiplexer 403 electrically connect to output terminals of the memory cells. An output terminal of the multiplexer 403 is electrically connected to a first input of the sense amplifier 401. In some embodiments, the sense amplifier 401 is substantially the same as the sense amplifier 10.

A multiplexer 404 selects one of the memory cells to be read by the sense amplifier 402 at a time. Input terminals of the multiplexer 404 electrically connect to output terminals of the memory cells. An output terminal of the multiplexer 404 is electrically connected to a first input of the sense amplifier 402. In some embodiments, the sense amplifier 402 is substantially the same as the sense amplifier 10.

The sense amplifiers 401, 402 of a sense amplifier block 400 share a reference current source 405. The reference current source 405 includes a first reference current on a first line 460, and a second reference current on a second line 461. In some embodiments, dummy lines (shown in phantom) electrically connected to ground surround the first and second lines 460, 461. In some embodiments, the first reference current is generated by a memory cell storing binary "1," and the second reference current is generated by a memory cell storing binary "0." For example, the first reference current is a very low current $I_L$, and the second reference current is a relatively high current $I_H$. The reference current source 405 merges the first and second reference currents to generate a reference current having amplitude substantially equal to $I_H+I_L$. The reference current is supplied to two sense amplifiers (the sense amplifiers 401, 402), so that each sense amplifier 401, 402 receives about half of the reference current (($I_H+I_L$)/2). The half of the reference current may approximate an average (or "midpoint") of the current generated by a bit cell storing binary "1" and the current generated by a bit cell storing binary "0."

In some embodiments, a second sense amplifier block 410 is substantially the same as the sense amplifier block 400. The second sense amplifier block 410 is adjacent the sense amplifier block 400, and also has a reference current source. In some embodiments, a third sense amplifier block 420 is substantially the same as the sense amplifier block 400. The third sense amplifier block 420 is adjacent the sense amplifier block 400, and also has a reference current source. In some embodiments, the sense amplifier blocks 400, 410, 420 all correspond to a single word line 440 driven by a word line driver 430.

Transistors 450, 451, 452 are configured to selectively merge (turned on) or isolate (turned off) the reference current sources of the sense amplifier blocks 400, 410, 420. For example, when the transistors 450, 451, 452 are turned on, the reference currents generated by the reference current sources are merged. For a configuration including 32 sense amplifiers, total reference current approaching $16(I_H+I_L)$ is shared by the 32 sense amplifiers, so that each sense amplifier receives a midpoint reference current of about $(I_H+I_L)/2$.

One advantage of using the circuit architecture of the sense amplifier 10 in the readout circuit 40 is that the reference-side mirror circuit (including the transistors 131, 132) isolates the sense amplifier 10 and selected bit cell from the reference current source (e.g. the reference current source 405). This isolation mostly eliminates disturbance from operation of the sense amplifier 10.

Figure 5:
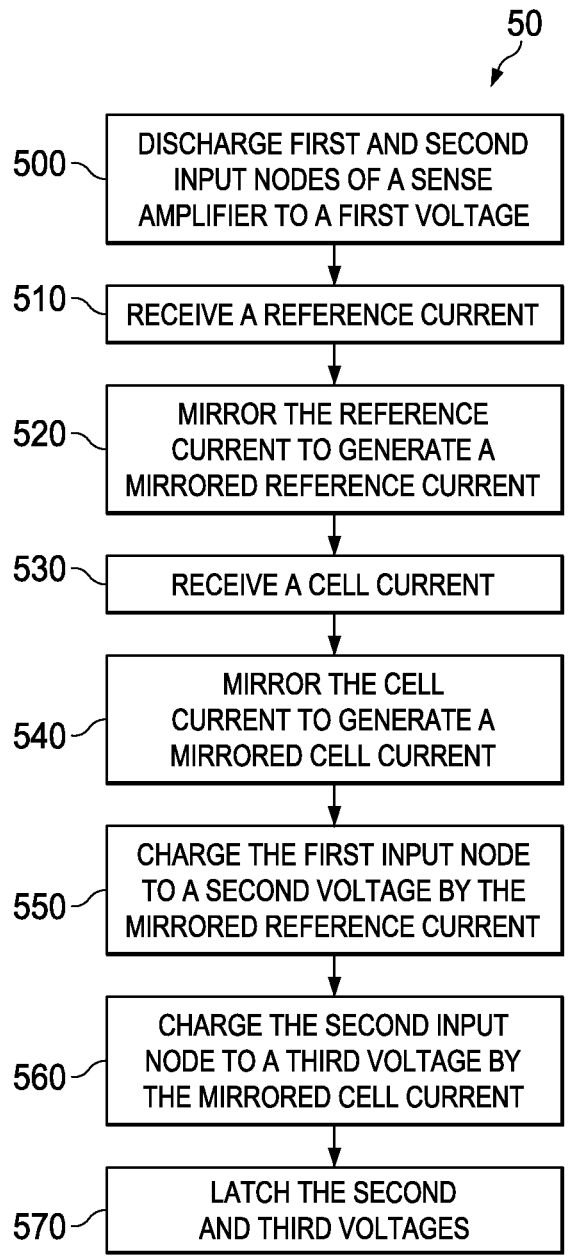
FIG. 5 is a flowchart of a method in accordance with various embodiments of the present disclosure.

FIG. 5 is a flowchart of a method 50 in accordance with various embodiments of the present disclosure. In some embodiments, the method 50 is performed by the sense amplifier 10 of FIG. 1. Description of the method 50 with reference to the sense amplifier 10 does not exclude the method 50 from being performed using other sense amplifier architectures.

First and second input nodes (e.g., the nodes 11 and 12) of a sense amplifier are discharged 500 to a first voltage (e.g., the second voltage VSS, ground, or the like). In some embodiments, the discharging 500 is performed by turning on a pair of transistors (e.g., the transistors 107, 108) electrically connected to the first and second input nodes in a pre-charging phase.

A reference current (e.g., the reference current Iref) is received 510 by a first transistor of a reference-side current mirror (e.g., the transistor 131). In some embodiments, the reference current is received 510 when a select transistor (e.g., the transistor 133) is turned on. In some embodiments, the receiving 510 includes conducting the reference current by the first transistor. In some embodiments, the reference current is generated by a single bit cell or by multiple bit cells (such as in FIG. 4). The reference current is mirrored 520 to generate a mirrored reference current. In some embodiments, the reference current is mirrored by a second transistor (e.g., the transistor 132).

A cell current (e.g., the cell current Icell) is received 530 by a third transistor of a cell-side current mirror (e.g., the transistor 121). In some embodiments, the cell current is received 530 when a select transistor (e.g., the transistor 123) is turned on. In some embodiments, the receiving 530 includes conducting the cell current by the third transistor. The cell current is mirrored 540 to generate a mirrored reference current. In some embodiments, the cell current is mirrored by a fourth transistor (e.g., the transistor 122).

The first input node is charged 550 to a second voltage by the mirrored reference current, and the second input node is charged 560 to a third voltage by the mirrored cell current. In some embodiments, the pair of transistors electrically connected to the first and second input nodes are turned off during the operations 520-560. The second and third voltages are then latched 570. In some embodiments, the latching 570 is performed by turning on a second pair of transistors (e.g., the transistors 105, 106) to turn on two cross-coupled inverter circuits having input and output nodes corresponding to the first and second input nodes.

Embodiments may achieve advantages. By mirroring the cell and reference currents to the sense amplifier 10, disturbance from operation of the sense amplifier 10 can be effectively reduced. Further, mirroring the reference current allows all reference currents on a same word line to be merged, which improves reference current distribution, and improves yield.

In accordance with various embodiments of the present disclosure, a device includes a first current mirror, a second current mirror, a first inverter, and a second inverter. The first current mirror is electrically connected to a reference current source of a memory array. The second current mirror is electrically connected to a cell current source of the memory array. The first inverter has a first input terminal electrically connected to the first current mirror, and a first output terminal. The second inverter has a second input terminal electrically connected to the second current mirror and the first output terminal, and a second output terminal electrically connected to the first current mirror and the first input terminal.

In accordance with various embodiments of the present disclosure, a device includes at least two sense amplifier blocks. Each sense amplifier block includes a first multiplexer, a second multiplexer, a reference current source, a first sense amplifier, and a second sense amplifier. The first multiplexer has at least two inputs electrically connected to first bit cells of a memory array. The second multiplexer has at least two inputs electrically connected to second bit cells of the memory array. The reference current source has a first reference line electrically connected to a first reference bit cell, and a second reference line electrically connected to a second reference bit cell. The first sense amplifier has a first input electrically connected to an output of the first multiplexer, and a second input electrically connected to a first output terminal of the reference current source. The second sense amplifier has a first input electrically connected to an output of the second multiplexer, and a second input electrically connected to a second output terminal of the reference current source. The device further includes at least two switches configured to merge reference currents supplied through the first and second reference lines of the at least two sense amplifier blocks.

In accordance with various embodiments of the present disclosure, a method includes (a) receiving a reference current; (b) mirroring the reference current to generate a mirrored reference current; (c) receiving a cell current; (d) mirroring the cell current to generate a mirrored cell current; (e) charging a first input node of a sense amplifier to a first voltage by the mirrored reference current; (f) charging a second input node of the sense amplifier to a second voltage by the mirrored cell current; and (g) latching the first and second voltages.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a first current mirror electrically connected to a reference current source of a memory array;
   a second current mirror electrically connected to a cell current source of the memory array, wherein the first current mirror and the second current mirror have an equivalent structure;
   a first inverter having:
     a first input terminal electrically connected to the first current mirror; and
     a first output terminal; and
   a second inverter having:
     a second input terminal electrically connected to the second current mirror and the first output terminal; and
     a second output terminal electrically connected to the first current mirror and the first input terminal;
   a first clamp transistor directly connected to the first current mirror and a first select transistor;
   a second clamp transistor electrically connected to the second current mirror and a second select transistor;
   the first select transistor directly connected to the first clamp transistor and the reference current source; and
   a second select transistor electrically connected to the second clamp transistor and the cell current source.

2. The device of claim 1, wherein:
   the first inverter has:
     a first transistor;
     a second transistor having a gate electrode electrically connected to a gate electrode of the first transistor; and
     a first enable transistor having a source electrode electrically connected to a drain electrode of the first transistor, and a drain electrode electrically connected to a drain electrode of the second transistor; and
   the second inverter has:
     a third transistor;
     a fourth transistor having a gate electrode electrically connected to a gate electrode of the third transistor; and
     a second enable transistor having a source electrode electrically connected to a drain electrode of the third transistor, and a drain electrode electrically connected to a drain electrode of the fourth transistor.

3. The device of claim 1, further comprising:
   a first pre-charge transistor electrically connected to the first input terminal; and
   a second pre-charge transistor electrically connected to the second input terminal.

4. The device of claim 1, wherein the first current mirror comprises:
   a first current mirror transistor, a source terminal of the first current mirror transistor being directly connected to a voltage supply, a drain terminal of the first current mirror transistor being connected to a clamp transistor; and
   a second current mirror transistor, a gate terminal of the second current mirror transistor being connected to a gate of the first current mirror transistor, and a source terminal of the second current mirror transistor being directly connected to the voltage supply.

5. The device of claim 1, wherein a gate terminal of the first clamp transistor is electrically connected to a gate terminal of the second clamp transistor.

6. The device of claim 2, further comprising:
   a third inverter having an input terminal electrically connected to the first output terminal; and
   a fourth inverter having an input terminal electrically connected to the drain electrode of the fourth transistor.

7. A device comprising:
   at least two sense amplifier blocks, each sense amplifier block including:
     a first multiplexer having at least two inputs electrically connected to first bit cells of a memory array;
     a second multiplexer having at least two inputs electrically connected to second bit cells of the memory array, the second multiplexer being physically disconnected from the first multiplexer;
     a reference current source having:
       a first reference line electrically connected to a first reference bit cell; and
       a second reference line electrically connected to a second reference bit cell;
     a first sense amplifier having a first input electrically connected to an output of the first multiplexer, and a second input electrically connected to a first output terminal of the reference current source; and
     a second sense amplifier having a first input electrically connected to an output of the second multiplexer, and a second input electrically connected to a second output terminal of the reference current source; and
   at least one switch configured to merge reference currents supplied through the first and second reference lines of the at least two sense amplifier blocks, wherein the merged reference currents continuously pass along a same conductive path, the conductive path extending to each of the at least two sense amplifier blocks.

8. The device of claim 7, wherein each of the first and second sense amplifiers comprises:
   a first current mirror electrically connected to the reference current source;
   a second current mirror electrically connected to the first or second multiplexer;
   a first inverter having:
      a first input terminal electrically connected to the first current mirror;
      a first output terminal; and
   a second inverter having:
      a second input terminal electrically connected to the second current mirror and the first output terminal; and
      a second output terminal electrically connected to the first current mirror and the first input terminal.

9. The device of claim 8, wherein:
   the first inverter has:
      a first transistor;
      a second transistor having a gate electrode electrically connected to a gate electrode of the first transistor; and
      a first enable transistor having a source electrode electrically connected to a drain electrode of the first transistor, and a drain electrode electrically connected to a drain electrode of the second transistor; and
   the second inverter has:
      a third transistor;
      a fourth transistor having a gate electrode electrically connected to a gate electrode of the third transistor; and
      a second enable transistor having a source electrode electrically connected to a drain electrode of the third transistor, and a drain electrode electrically connected to a drain electrode of the fourth transistor.

10. The device of claim 8, wherein each of the first and second sense amplifiers further comprises:
    a first pre-charge transistor electrically connected to the first input terminal; and
    a second pre-charge transistor electrically connected to the second input terminal.

11. The device of claim 8, wherein each of the first and second sense amplifiers further comprises:
    first clamp transistor electrically connected to the first current mirror and the reference current source; and
    a second clamp transistor electrically connected to the second current mirror and a memory cell.

12. The device of claim 11, wherein each of the first and second sense amplifiers further comprises:
    a first select transistor electrically connected to the first clamp transistor and the reference current source; and
    a second select transistor electrically connected to the second clamp transistor and the memory cell.

13. The device of claim 8, wherein each of the first and second sense amplifiers further comprises:
    a third inverter having an input terminal electrically connected to the first output terminal; and
    a fourth inverter having an input terminal electrically connected to the second output terminal.

14. A method comprising:
    (a) receiving a reference current;
    (b) mirroring the reference current to generate a mirrored reference current;
    (c) receiving a cell current;
    (d) mirroring the cell current to generate a mirrored cell current;
    (e) receiving a first sense amplifier enable signal from a controller by a first transistor and a second transistor of a sense amplifier, a drain electrode of the first transistor being directly connected to a current mirror that mirrors the cell current and a drain electrode of the second transistor being directly connected to a current mirror that mirrors the reference current, the first sense amplifier enable signal having a voltage that is sufficiently high to turn off the first transistor and the second transistor;
    (f) charging a first input node of the sense amplifier to a first voltage by the mirrored reference current;
    (g) charging a second input node of the sense amplifier to a second voltage by the mirrored cell current;
    (h) receiving a second sense amplifier enable signal by the first transistor and the second transistor of the sense amplifier, the second sense amplifier enable signal having a voltage that is sufficiently low to turn on the first transistor and the second transistor; and
    (i) latching the first and second voltages.

15. The method of claim 14, further comprising:
    (j) discharging the first and second input nodes of the sense amplifier to a third voltage prior to (e) and (f).

16. The method of claim 14, wherein (a) includes receiving the reference current from a reference current source shared between the sense amplifier and another sense amplifier.

17. The method of claim 14, further comprising:
    (k) outputting a differential sense signal by inverting the first voltage by a first inverter and inverting the second voltage by a second inverter.

18. The method of claim 14, wherein (c) includes receiving the cell current generated by a resistive random access memory (RRAM) bit cell.

19. The method of claim 14, wherein (a) includes receiving the reference current from a reference current source shared between the sense amplifier and at least three other sense amplifiers.

20. The method of claim 14, wherein (a) includes receiving a merged current including first current from a first bit cell programmed to binary "1" and second current from a second bit cell programmed to binary "0".

* * * * *